United States Patent
Blair et al.

(10) Patent No.: US 6,879,199 B2
(45) Date of Patent: Apr. 12, 2005

(54) PWM CONTROL SIGNAL GENERATION METHOD AND APPARATUS

(75) Inventors: Barry Olen Blair, Garland, TX (US); Gregory H. Fasullo, Dallas, TX (US); James Edward Harvey, Heath, TX (US); Donald Marabell, Dallas, TX (US)

(73) Assignee: Valere Power, Inc., Richardson, TX (US)

(*) Notice: Subject to any disclaimer, the term of this patent is extended or adjusted under 35 U.S.C. 154(b) by 0 days.

(21) Appl. No.: 10/077,408

(22) Filed: Feb. 15, 2002

(65) Prior Publication Data

US 2003/0155952 A1 Aug. 21, 2003

(51) Int. Cl.$^7$ ............................. H03K 5/13; H03K 1/04
(52) U.S. Cl. ...................... 327/257; 327/258; 327/295
(58) Field of Search ................................ 327/293, 291, 327/295, 296, 297, 239, 253–259, 172–176; 363/17

(56) References Cited

U.S. PATENT DOCUMENTS

| | | | | |
|---|---|---|---|---|
| 4,015,213 A | * | 3/1977 | Hamada .................... 330/10 |
| 4,020,422 A | * | 4/1977 | Underhill ................... 327/12 |
| 4,330,751 A | * | 5/1982 | Swain ...................... 327/114 |
| 4,639,849 A | | 1/1987 | Noworolski et al. ......... 363/56 |
| 4,860,189 A | | 8/1989 | Hitchcock ................. 363/132 |
| 5,124,573 A | * | 6/1992 | Wong ....................... 327/155 |
| 5,198,969 A | | 3/1993 | Redl et al. .................. 363/17 |
| 5,227,961 A | * | 7/1993 | Claydon et al. ............. 363/17 |
| 5,418,486 A | * | 5/1995 | Callahan .................... 327/310 |
| 5,483,303 A | * | 1/1996 | Hirschman ................ 351/118 |
| 6,016,258 A | | 1/2000 | Jain et al. ................... 363/17 |
| 6,163,466 A | | 12/2000 | Davila, Jr. et al. ........... 363/17 |
| 6,316,979 B1 | * | 11/2001 | Keeth ........................ 327/258 |
| 6,388,855 B1 | * | 5/2002 | Ikezu ........................ 361/100 |

OTHER PUBLICATIONS

Jovanovic, Milan M., et al.; "Zero–Voltage–Switching Technique in High–Frequency Off–Line Converters"; *IEEE*; 1988; pp. 23–32; CH2504–9/88/0000–0023; Blacksburg, Virginia.

Hayes, J.G., Mohan, N., and Henze, C.P.; "Zero–Voltage Switching in a Constant Frequency Digitally Controlled Resonant DC–DC Power Converter"; University of Minnesota, Dept. of Elect. Eng. and Unisys Corporation; 1988; pp. 360–367; CH2504.

Andreycak, Bill; Abstract of "Phase Shifted, Zero Voltage Transition Design Considerations and the UC3875 PWM Controller"; Unitrode Corporation; May 1997; pp. 1–14; SLUA107 (U–136A); Merrimack, New Hampshire.

* cited by examiner

*Primary Examiner*—Tuan T. Lam
(74) *Attorney, Agent, or Firm*—Carr LLP

(57) ABSTRACT

Disclosed is an apparatus for generating two constant width and symmetrical drive signals from two separate, but complementary, pulse width modulated control signals while also generating two pulse width modulated drive signals corresponding to said pulse width modulated control signals. The constant width drive signals are generated through the use of a toggle or latch set/reset circuit actuated by a given characteristic of each of the control signals.

9 Claims, 2 Drawing Sheets

PWM CONTROL SIGNAL GENERATION METHOD AND APPARATUS

TECHNICAL FIELD

The present invention relates generally to a drive signal generation and, more specifically, to a circuit for converting two controllable pulse signals to two sets of drive signals, one set of which is pulse width modulated (PWM). The drive signals are used for providing control of power applied a load using power conversion topologies, such as a full bridge DC/DC converter operating in a Zero Voltage Switching (ZVS) operation mode.

BACKGROUND

A common practice in the field of power conversion is to use switching power supplies to convert DC voltage of one level to a DC voltage at a second level. A circuit topology that is well suited for this purpose is the full bridge converter. A common ZVS topology for a prior art full bridge converter is a phase-shifted full bridge. In other words, the drive signal that is used to control the full bridge converter comprises phase shifted signals.

An example of one such circuit is described in detail in a Texas Instruments (formerly Unitrode Corp.) generated application note U-136A entitled "Phase Shifted Zero Voltage Transition Design Considerations and the UC3875 PWM Controller," published in May 1997, and presently available from Texas Instruments, Inc. The phase shifted full bridge described therein requires a special function chip to translate a DC control voltage into a phase shifted signal for driving one side of the full bridge switches.

As will be realized, special function chips typically cost more to purchase and are single sourced as compared to integrated circuits that are widely used in the industry. Further, if changes are required in the phase shifting control signal to output algorithm for a similar but different application, a new special function chip may be required. Also phase shifting circuitry is typically more complicated and susceptible to noise creating jitter than PWM signal generating circuitry.

It would thus be desirable, where product cost, multiple sourcing and simplified circuitry are among the design considerations, to be able to use an industry standard existing integrated circuit as a signal source for generating a duration controlled set of output pulses. Such a chip may be used in conjunction with a further circuit, which may advantageously utilize discrete components for generating a pair of constant width drive signals and a further pair of PWM drive signals to operate a full bridge converter power supply.

SUMMARY OF THE INVENTION

The present invention comprises providing a simplified PWM drive signal circuit for operating (driving) a full bridge converter power supply where PWM control signals are obtained from an industry standardized control circuit to overcome the cost and circuit algorithm alteration disadvantages of controlled phase shifting circuitry used in the prior art.

BRIEF DESCRIPTION OF THE DRAWINGS

For a more complete understanding of the present invention, and its advantages, reference will now be made in the following Detailed Description to the accompanying drawings, in which.

DETAILED DESCRIPTION

Figure 1:
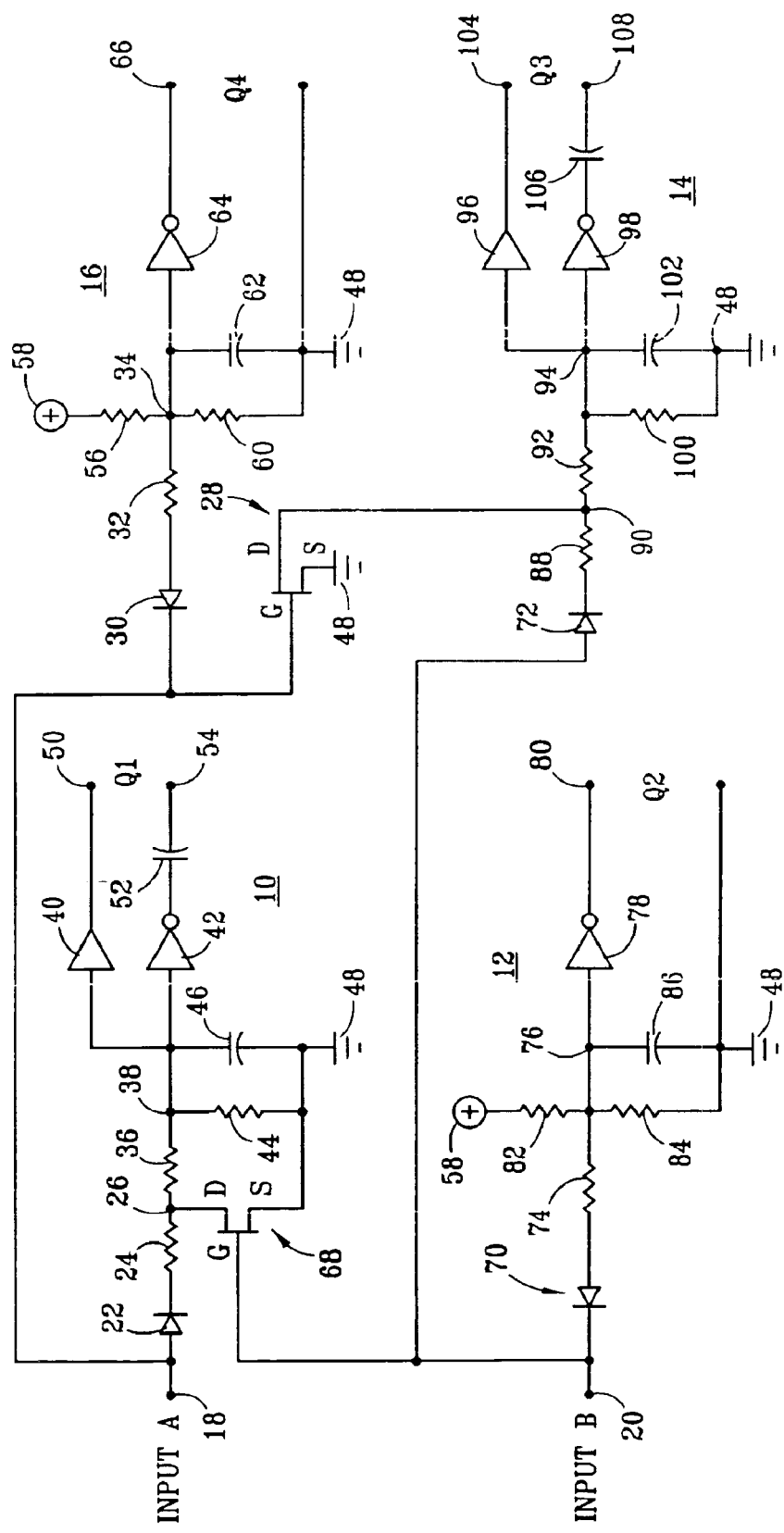
FIG. 1 is a circuit diagram of the generator described herein.

The circuit of FIG. 1 includes four sections labeled generally 10, 12, 14, and 16 for generating drive signals indicated as Q1, Q2, Q3, and Q4, respectively. The circuit operates in response to non-overlapping pulse width modulated control signals A and B applied to input terminals 18 and 20, respectively. The control signals A and B may be generated by a variety of sources, such as a Texas Instruments, Inc. integrated circuit sold under the designation UC2825ADW. In conjunction with the present generator circuit, this chip was used to provide a pulse width modulated pair of control signals in response to a load current sensitive control signal. By non-overlapping, we mean that a given pulse width modulated signal can vary in width from substantially zero width to substantially (but not greater than) fifty percent of a duty cycle. It should be appreciated by those skilled in the art that many other similar circuits may be used to provide the input non-overlapping PWM input control signals utilized by the present invention.

The control signal A is applied through a series connection of a diode 22 and a resistance 24 to a junction point 26. Signal A is also supplied to a gate terminal of a field effect transistor (FET) 28, as well as through a series connection of a diode 30 and a resistance 32 to a junction point 34. A resistor 36 is connected between junction point 26 and a junction point 38, where junction point 38 is further connected to the inputs of isolation/driver amplifiers 40 and 42. Amplifier 42 includes an inverting circuit at the output thereof, as represented by the small circle shown. A resistance 44 is connected in parallel with a capacitance 46 between junction point 38 and a ground or reference voltage point 48. The output of amplifier 40 is connected to a first Q1 output drive signal terminal 50. A capacitance 52 is shown connected between the inverting output of amplifier 42 and a second Q1 output drive signal terminal 54.

Referring now to circuit section 16, it may be observed that a resistance 56 is connected between junction point 34 and a positive direct voltage power terminal 58. A resistance 60 is connected in parallel with a capacitance 62 between junction point 34 and ground 48. An amplifier 64 having an inverting output is connected between junction point 34 and an output driver terminal 66. The output drive signal labeled Q4 is obtained between terminal 66 and ground 48.

The B control signal terminal 20 is connected to a gate terminal of an FET 68 having its drain terminal connected to junction point 26 and its source terminal connected to ground 48. Terminal 20 is also connected to the cathode of diode 70 and to the anode of a diode 72. The anode of diode 70 is connected through a resistance 74 to a junction point 76, which serves as an input to an amplifier 78 having an inverting output terminal labeled 80. A resistance 82 is connected between junction point 76 and the positive power terminal 58. A resistance 84 is connected in parallel with a capacitance 86 between junction point 76 and ground 48. The Q2 output drive signal is provided between ground 48 and terminal 80.

The anode of diode 72 is connected through a resistance 88 to a junction point 90. A drain terminal of the aforementioned FET 28 is also connected to junction point 90, while the source terminal of FET 28 is connected to ground 48. A resistance 92 is connected between junction point 90 and a junction point 94, which serves as an input to amplifiers 96 and 98. A resistance 100 is connected in parallel with a capacitance 102 between junction point 94 and ground 48.

A first Q3 output terminal 104 is connected to the output of amplifier 96. A capacitance 106 is connected between an inverting output of amplifier 98 and a second Q3 output terminal 108.

Figure 2:
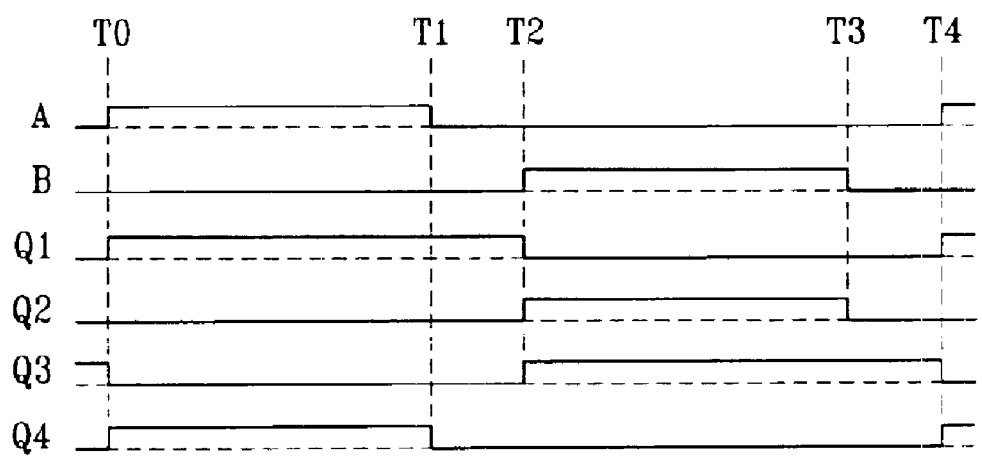
FIG. 2 comprises a set of waveforms used in describing the operation of the circuit of FIG. 1.

In FIG. 2, times T0, T1, T2, T3, and T4 are showing occurring serially in time and represent one cycle of operation. The time between T0 and T2 is identical to the time between T2 and T4. Times T1 and T3 are representative of the end of a pulse width modulated signal and thus vary from cycle to cycle in accordance with control feedback signals. As illustrated, time T1 represents about eighty percent of the possible ON duration of waveform A and, therefore, about forty percent of the time of a full operational cycle. Signal A is shown having a positive transition at time T0 and returning to a low level at time T1, while signal B is shown having a positive transition at time T2 and returning to a low level at time T3. A drive signal waveform Q1, as would be obtained between terminals 50 and 54 in FIG. 1, becomes positive immediately after T0 (although shown to be coincident for ease of description) and becomes negative immediately after T2. As shown, Q1 completes a cycle by going positive again immediately after T4. A signal waveform labeled Q3 is the inverse of Q1 and is obtained from between terminals 104 and 108. A pulse width modulated waveform labeled Q2 becomes positive immediately after T2 and returns to a low level immediately after T3 in response to the transitions of waveform B. A final pulse width modulated waveform labeled Q4 becomes positive immediately after T0 and returns to a low level immediately after T1 in response to the transitions of waveform A.

Figure 3:
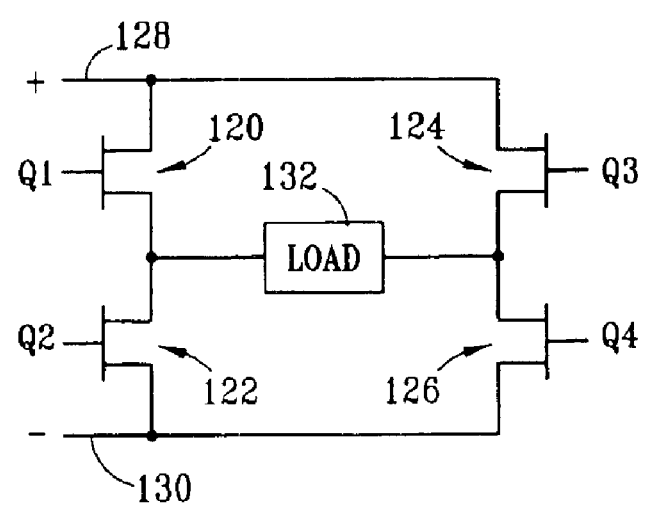
FIG. 3 illustrates a typical, but generalized, load circuit of the type driven by the circuit of FIG. 1.

FIG. 3 illustrates, in broad and generalized form, a bridge circuit having FET switches 120, 122, 124, and 126 connected as shown for converting a first DC voltage between terminals 128 and 130 to a second level voltage for use by a load shown as 132. For more detail on such a bridge circuit, both as to operation and components, reference can be made to many publications, such as the above-referenced Unitrode application note or co-pending patent application Ser. No. 10/077,426 (Docket No. VPI 2424000) entitled "DC/DC ZVS Full Bridge Converter Power Supply Method and Apparatus" filed on Feb. 15, 2002.

As will be realized from the circuit operation details to follow, the circuits 10 and 14, of FIG. 1, operate in the manner of set/reset latch circuits or of toggle circuits which are caused to change output levels with each positive transition of either one of input signals A and B to produce constant width (non-PWM) output drive signals.

Reference will now be made to both FIGS. 1 and 2. When drive signal A, applied to terminal 18, goes positive (raises in potential) at time T0, the signal passes through diode 22 to charge capacitor 46 and causes the amplifier 40 to raise the potential at terminal 50 with respect to the inverted output from amplifier 42 as supplied through capacitor 52 to the other Q1 output terminal 54. The charged capacitor 46 maintains this output after signal A drops to zero at time T1. When signal B, applied to terminal 20, raises in potential, at time T2, FET 68 is activated to cause junction point 26 to be placed at near ground potential. This activation causes the capacitor 46 to discharge, whereby output terminal 50 is lowered to a potential less than the inverted output from amplifier 42 at terminal 54. As mentioned previously, the rise in potential of output Q1 occurs a finite period of time after the rise of control signal A in order to partially charge the capacitor 46. The same comment applies to the discharge of capacitor 46 when signal B activates FET 68. However, for discussion and illustration purposes, the output Q1 is shown as changing states simultaneously with the positive transitions of each of signals A and B. It is thus apparent that circuit 10 is toggled by the positive transitions of the two control signals to produce a symmetrical and constant width drive signal.

The above description applies, in a similar manner, to toggle circuit 14 for outputting the Q3 drive signal from the pulse width modulated control signals A and B.

Reference will now be made to circuit 16. Prior to the positive transition of signal A at time T0, the anode of diode 30 is effectively grounded through the source of control signal A whereby capacitor 62 is kept in a discharged state and the Q4 output is maintained at a substantially zero level. At time T0, signal A raises the potential on the anode of diode 30, the capacitor is charged by current from positive terminal 58 and through the action of amplifier 64 and its output inverting stage, the Q4 signal rises in potential relative ground 48. When signal A returns to effectively ground potential at pulse width modulated time T1, the capacitor 62 is discharged and terminal 66 returns to ground potential.

Action occurs in stage 12 for producing drive signal Q2 in a substantially identical manner with respect to pulse width modulated drive signal B.

These four drive signals Q1 through Q4 may be applied to a full bridge rectifier circuit, such as shown in FIG. 3, to convert DC voltage levels, as discussed in the co-pending patent application.

Although the invention has been described with reference to a specific embodiment, these descriptions are not meant to be construed in a limiting sense. Various modifications of the disclosed embodiments, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method of creating a symmetrical signal from a pair of pulse width modulated signals, comprising the steps of:

applying one of the pair of pulse width modulated signals both to a set input of a plurality of latch circuits and to a delay circuit;

applying the other of the pair of pulse width modulated signals to a reset input of the plurality of latch circuits, wherein both of the pair of pulse width modulated signals have substantially constant and equidistant start transition times;

obtaining a constant width drive signal from the output of at least one latch circuit of the plurality of latch circuits; and obtaining a second pulse width modulated drive signal from an output of the delay circuit.

2. Apparatus for generating a symmetrical signal from a complementary pair of pulse width modulated signals, comprising:

a first pulse width modulated control signal supplying means;

a second pulse width modulated control signal supplying means, wherein both of the pair of pulse width modulated control signal supplying means have substantially constant and equidistant start transition times;

a plurality of toggle circuits, connected to said first and second control signal supplying means, at least one toggle circuit of the plurality of toggle circuits supplying a first output drive signal level upon detecting a given characteristic of a first pulse width modulated control signal received from said first supplying means and supplying a second output drive signal level upon detecting said given characteristic of a second pulse width modulated control signal received from said second supplying means, whereby substantially symmetrical first and second output drive signals are generated from said at least one toggle circuit of the plurality of toggle circuits; and a delay circuit connected at least to the first pulse width modulated control signal supplying means, wherein the delay circuit at least provides a pulse width modulated drive signal.

3. A method of generating a pulse width modulated signal and a symmetrical signal from a pair of pulse width modulated signals, comprising the steps of:

applying one of the pair of first pulse width modulated signals to a set input of a plurality of latch circuits as well as to a turn-on delay circuit wherein the turn-on delay is such that an output voltage transition of the turn-on delay circuit coincides with an output voltage transition of at least one latch circuit of the plurality of latch circuits;

applying the other of the pair of first pulse width modulated signals to a reset input of the plurality of latch circuits;

obtaining a constant pulse width drive signal from the output of at least one latch circuit of the plurality of latch circuits; and obtaining a second pulse width modulated drive signal from the output of the turn-on delay circuit.

4. A method of generating a pulse width modulated signal and a symmetrical signal from a pair of pulse width modulated signals, comprising the steps of:

applying one of the pair of first pulse width modulated signals to a plurality of toggle circuits as well as to a delayed turn-on drive circuit wherein the turn-on delay is such that an output voltage transition of the delayed turn-on circuit coincides with an output voltage transition of at least one toggle circuit of the plurality of toggle circuits;

applying the other of the pair of first pulse width modulated signals to said plurality of toggle circuits;

obtaining a symmetrical drive signal from the output of said at least one toggle circuit of the plurality of toggle circuits; and obtaining a second pulse width modulated drive signal from the output of the delayed turn-on circuit.

5. A method of generating drive signals from a pair of pulse width modulated input control signals, comprising the steps of:

applying both of a pair of pulse width modulated control signals to a plurality of first drive circuits;

toggling at least one first drive circuit between predetermined output drive signal voltage levels upon detection of a given transition characteristic of each of the pair of pulse width modulated input control signals; and delaying the application of one of said pair of pulse width modulated control signals to a second drive circuit whereby an output voltage transition of the second circuit coincides with an output voltage transition of the toggled drive circuit.

6. A method of generating drive signals from a pair of pulse width modulated input control signals, comprising the steps of:

applying both of a pair of pulse width modulated control signals to a first drive circuit;

toggling said first drive circuit between predetermined output drive signal voltage levels upon detection of a given transition characteristic of each of the pair of pulse width modulated input control signals;

delaying the application of one of said pair of pulse width modulated control signals to a second drive circuit whereby an output voltage transition of the second circuit coincides with an output voltage transition of the toggled drive circuit;

applying said pair of pulse width modulated control signals to a third drive circuit for toggling said third drive circuit whereby a drive signal complementary to the output drive signal of said first drive circuit is generated; and delaying the application of the other of said pair of pulse width modulated control signals to a fourth drive circuit whereby an output voltage transition of said fourth circuit coincides with an output voltage transition of one of the toggled drive circuits.

7. Apparatus for generating a pulse width modulated signal and a symmetrical signal, comprising:

first and second pulse width modulated signal supplying means;

a plurality of latch circuits, connected to said first and second signal supplying means, the plurality of latch circuits changing states upon detection of a given characteristic of received pulse width modulated signals at set and reset inputs thereof; and a delayed turn-on circuit, connected to said first signal supplying means, the turn-on circuit receiving the pulse width modulated signal therefrom, the turn-on delay causing an output voltage transition of the delayed turn-on circuit to coincide with an output voltage transition of at least one latch circuit of the plurality of latch circuits.

8. Apparatus for generating a pulse width modulated signal and a symmetrical signal, comprising:

first and second pulse width modulated signal supplying means;

a plurality of toggle circuits, connected to said first and second signal supplying means, the plurality of toggle circuits toggling between first output drive signal states upon detection of a given characteristic of received pulse width modulated signals; and a delayed turn-on circuit, connected to said first signal supplying means, the delayed turn-on circuit receiving a pulse width modulated signal therefrom, the turn-on delay causing a voltage transition of a generated second output drive signal of the turn-on delay circuit to coincide with an output voltage transition of the first output drive signal.

9. Apparatus for generating a pulse width modulated signal and a symmetrical signal, comprising:

first and second pulse width modulated signal supplying means;

a toggle circuit, connected to said first and second signal supplying means, the toggle circuit toggling between first output drive signal states upon detection of a given characteristic of received pulse width modulated signals;

a delayed turn-on circuit, connected to said first signal supplying means, the delayed turn-on circuit receiving a pulse width modulated signal therefrom, the turn-on delay causing a voltage transition of a generated second output drive signal of the turn-on delay circuit to coincide with an output voltage transition of the first output drive signal;

an additional toggle circuit, connected to said first and second signal supplying means, the additional toggle circuit generating an output drive signal complementary to the first drive signal; and an additional delayed turn-on circuit, connected to said first signal supplying means, the additional delayed turn-on circuit generating a fourth output drive signal complementary to said second output drive signal.

* * * * *